(12) United States Patent
Nam et al.

(10) Patent No.: US 11,608,400 B2
(45) Date of Patent: Mar. 21, 2023

(54) COMPOSITION FOR ENCAPSULATING ORGANIC LIGHT EMITTING ELEMENT AND ORGANIC LIGHT EMITTING ELEMENT DISPLAY DEVICE MANUFACTURED THEREFROM

(71) Applicant: SAMSUNG SDI CO., LTD., Yongin-si (KR)

(72) Inventors: Seong Ryong Nam, Suwon-si (KR); Mi Jeong Choi, Suwon-si (KR); Sung Min Ko, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 634 days.

(21) Appl. No.: 15/769,496

(22) PCT Filed: Aug. 25, 2016

(86) PCT No.: PCT/KR2016/009430
§ 371 (c)(1),
(2) Date: Apr. 19, 2018

(87) PCT Pub. No.: WO2017/069392
PCT Pub. Date: Apr. 27, 2017

(65) Prior Publication Data
US 2018/0342674 A1 Nov. 29, 2018

(30) Foreign Application Priority Data
Oct. 19, 2015 (KR) .................. 10-2015-0145677

(51) Int. Cl.
*C08F 230/08* (2006.01)
*C08F 2/50* (2006.01)
(Continued)

(52) U.S. Cl.
CPC .......... *C08F 230/08* (2013.01); *C07F 7/1804* (2013.01); *C08F 2/50* (2013.01);
(Continued)

(58) Field of Classification Search
CPC ... H01L 51/5237; H01L 51/5253–5259; C08F 230/08
See application file for complete search history.

(56) References Cited

U.S. PATENT DOCUMENTS 5,066,751 A * 11/1991 Kotachi ................ G03F 7/0758
526/279
2003/0236375 A1* 12/2003 Salamone ............. C08F 220/12
526/307.7
(Continued)

FOREIGN PATENT DOCUMENTS

CN 101747860 A 6/2010
CN 103309162 A 9/2013
(Continued)

OTHER PUBLICATIONS

Machine Translation of JP-2008210845-A.*
(Continued)

*Primary Examiner* — William E McClain
(74) *Attorney, Agent, or Firm* — Lee IP Law, P.C.

(57) ABSTRACT

Provided are a composition for encapsulating an organic light emitting element and an organic light emitting element display device manufactured therefrom, the composition comprising: (A) a non-silicone-based photocurable multifunctional monomer; (B) a silicone-based photocurable multifunctional monomer; (C) a non-silicone-based photocurable monofunctional monomer; (D) a silicone-based photocurable monofunctional monomer; and (E) an initiator, wherein the silicone-based photocurable multifunctional monomer (B) is represented by chemical formula 1.

10 Claims, 2 Drawing Sheets

(51) Int. Cl.
*H01L 51/52* (2006.01)
*C07F 7/18* (2006.01)
*C08F 22/12* (2006.01)
*H01L 33/00* (2010.01)
*H01L 51/00* (2006.01)
*C08G 77/20* (2006.01)
*C08F 220/30* (2006.01)

(52) U.S. Cl.
CPC .............. *C08F 22/12* (2013.01); *H01L 33/00* (2013.01); *H01L 51/00* (2013.01); *H01L 51/5253* (2013.01); *C08F 220/301* (2020.02); *C08G 77/20* (2013.01)

(56) References Cited

U.S. PATENT DOCUMENTS

| | | | |
|---|---|---|---|
| 2006/0057222 A1* | 3/2006 | Linhardt | C08F 2/22 424/490 |
| 2012/0125431 A1* | 5/2012 | Oizumi | H01L 51/5259 136/256 |
| 2015/0056757 A1* | 2/2015 | Liu | H01B 3/447 438/127 |
| 2015/0252125 A1 | 9/2015 | Moro et al. | |
| 2015/0280151 A1 | 10/2015 | Nam et al. | |

FOREIGN PATENT DOCUMENTS

| | | | | |
|---|---|---|---|---|
| DE | 102009003223 A1 | * | 12/2010 | ............ B32B 27/08 |
| JP | 02258815 A | * | 10/1990 | ............ C08F 230/08 |
| JP | 2007-314758 A | | 12/2007 | |
| JP | 2008210845 A | * | 9/2008 | |
| JP | 2013-076097 A | | 4/2013 | |
| JP | 2015-189977 A | | 11/2015 | |
| KR | 10-2011-0020133 A | | 3/2011 | |
| KR | 10-2011-0071039 A | | 6/2011 | |
| KR | 10-2014-0034882 A | | 3/2014 | |
| KR | 10-2015-0105897 A | | 9/2015 | |
| KR | 10-2015-0114400 A | | 10/2015 | |

OTHER PUBLICATIONS

Machine Translation of JP-02258815-A.*
Office Action dated Aug. 16, 2019 in the corresponding Chinese Patent Application No. 201680061108.9.
International Search Report dated Mar. 28, 2017 for PCT/KR2016/009430, filed on Aug. 25, 2016.
Japanese Office Action dated Apr. 28, 2020.

* cited by examiner

COMPOSITION FOR ENCAPSULATING ORGANIC LIGHT EMITTING ELEMENT AND ORGANIC LIGHT EMITTING ELEMENT DISPLAY DEVICE MANUFACTURED THEREFROM

CROSS REFERENCE TO RELATED APPLICATIONS

This is the U.S. national phase application based on PCT Application No. PCT/KR2016/009430, filed Aug. 25, 2016, which is based on Korean Patent Application No. 10-2015-0145677, filed Oct. 19, 2015, the entire contents of all of which are hereby incorporated by reference.

TECHNICAL FIELD

The present invention relates to a composition for encapsulation of an organic light emitting device and an organic light emitting display fabricated using the same.

BACKGROUND ART

An organic light emitting display includes an organic light emitting device. Such an organic light emitting device can suffer from deterioration in light emitting properties upon contact with external moisture and/or oxygen. Thus, the organic light emitting device must be encapsulated with an encapsulation composition. The organic light emitting device is encapsulated in a multilayer structure including an inorganic barrier layer and an organic barrier layer. The inorganic barrier layer is formed by plasma deposition, which can cause the organic barrier layer to be etched by plasma. When the organic barrier layer is etched, an encapsulation function of the organic barrier layer can be damaged. As a result, the organic light emitting device can suffer from deterioration in light emitting properties and reliability. Recently, a flexible organic light emitting display has been developed in the art. Thus, an organic barrier layer is also required to have good flexibility.

The background technique of the present invention is disclosed in Korean Patent Publication No 2011-0071039 A.

DISCLOSURE

Technical Problem

It is one aspect of the present invention to provide a composition for encapsulation of an organic light emitting device which can realize an organic barrier layer having good plasma resistance and improve reliability of an organic light emitting device.

It is another aspect of the present invention to provide a composition for encapsulation of an organic light emitting device which can realize an organic barrier layer having low modulus.

It is a further aspect of the present invention to provide a composition for encapsulation of an organic light emitting device which can be used in a flexible organic light emitting display.

It is yet another aspect of the present invention to provide a composition for encapsulation of an organic light emitting device which can realize an organic barrier layer having high light transmittance and has high photocuring rate.

It is yet another aspect of the present invention to provide a composition for encapsulation of an organic light emitting device which can easily form an organic barrier layer by deposition, inkjet printing, or the like.

Technical Solution

In accordance with one aspect of the present invention, a composition for encapsulation of an organic light emitting device includes: (A) a non-silicone-based photocurable polyfunctional monomer; (B) a silicone-based photocurable polyfunctional monomer; (C) a non-silicone-based photocurable monofunctional monomer; (D) a silicone-based photocurable monofunctional monomer; and (E) an initiator, wherein the (B) silicone-based photocurable polyfunctional monomer is represented by Formula 1:

<Formula 1> wherein in Formula 1, $R_1$, $R_2$, $R_3$, $R_4$, $X_1$, $X_2$, $X_3$, $X_4$, $X_5$, $X_6$, and n are the same as defined in the following detailed description.

In accordance with another aspect of the present invention, an organic light emitting display includes: an organic light emitting device; and a barrier stack formed on the organic light emitting device and including an inorganic barrier layer and an organic barrier layer, wherein the organic barrier layer is formed of the composition for encapsulation of an organic light emitting diode according to the present invention.

Advantageous Effects

The present invention provides a composition for encapsulation of an organic light emitting device which can realize an organic barrier layer having good plasma resistance. Thus, the composition for encapsulation of an organic light emitting device can improve reliability of an organic light emitting device.

The present invention provides a composition for encapsulation of an organic light emitting device which can realize an organic barrier layer having low modulus.

The present invention provides a composition for encapsulation of an organic light emitting device which can be used in a flexible organic light emitting display.

The present invention provides a composition for encapsulation of an organic light emitting device which has high photocuring rate. Thus, the composition for encapsulation of an organic light emitting device can realize an organic barrier layer having high light transmittance.

The present invention provides a composition for encapsulation of an organic light emitting device which can easily form an organic barrier layer by deposition, inkjet printing, or the like.

BEST MODE

Embodiments of the present invention will be described in detail with reference to the accompanying drawings. It should be understood that the present invention may be embodied in different ways and is not limited to the following embodiments. In the drawings, portions irrelevant to the description will be omitted for clarity. Like components will be denoted by like reference numerals throughout the specification.

As used herein, the term "(meth)acryl" may refer to "acryl" and/or "methacryl".

As used herein, unless otherwise stated, the term "substituted" means that at least one hydrogen atom of a functional group is substituted with a halogen (for example, F, Cl, Br or I), a hydroxyl group, a nitro group, a cyano group, an imino group (=NH, =NR, R being a $C_1$ to $C_{10}$ alkyl group), an amino group (—$NH_2$, —NH(R'), —N(R")(R'"), R', R" and R'" being each independently a $C_1$ to $C_{10}$ alkyl group), an amidino group, a hydrazine or hydrazone group, a carboxyl group, a $C_1$ to $C_{20}$ alkyl group, a $C_6$ to $C_{30}$ aryl group, a $C_3$ to $C_{30}$ cycloalkyl group, a $C_3$ to $C_{30}$ heteroaryl group, or a $C_2$ to $C_{30}$ heterocycloalkyl group.

As used herein, the term "aryl group" refers to a functional group in which all elements of a cyclic substituent have p-orbitals and these p-orbitals are conjugated. The aryl group includes monocyclic, non-fused polycyclic or fused polycyclic functional groups. Here, the term "fused" means that a pair of carbon atoms is shared by contiguous rings. The aryl group also includes biphenyl groups, terphenyl groups, or quaterphenyl groups, in which at least two aryl groups are connected to each other through a sigma bond. The aryl group may refer to a phenyl group, a naphthyl group, an anthracenyl group, a phenanthrenyl group, a pyrenyl group, a chrysenyl group, and the like.

As used herein, the term "heteroaryl group" refers to a functional group in which an aryl group contains 1 to 3 hetero atoms selected from the group consisting of N, O, S, P and Si, and the other atoms in the aryl group are carbon. The heteroaryl group also includes a functional group in which at least two heteroaryl groups are directly connected through a sigma bond. The heteroaryl group also includes a functional group in which at least two heteroaryl groups are fused. If the heteroaryl groups are fused, each ring may include 1 to 3 heteroatoms as set forth above. The heteroaryl group may refer to, for example, a pyridinyl group, a pyrimidinyl group, a pyrazinyl group, a pyridazinyl group, a triazinyl group, a quinolinyl group, an isoquinolinyl group, and the like.

More specifically, the $C_6$ to $C_{30}$ aryl group and/or the $C_3$ to $C_{30}$ heteroaryl group may be a substituted or unsubstituted phenyl group, a substituted or unsubstituted naphtyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenyl group, a substituted or unsubstituted p-terphenyl group, a substituted or unsubstituted m-terphenyl group, a substituted or unsubstituted chrysenyl group, a substituted or unsubstituted triphenylenyl group, a substituted or unsubstituted phenylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazoyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzothiazinyl group, a substituted or unsubstituted acridinyl group, a substituted or unsubstituted phenazinyl group, a substituted or unsubstituted phenothiazinyl group, a substituted or unsubstituted phenoxazinyl group, a substituted or unsubstituted dibenzofuranyl group, a substituted or unsubstituted dibenzothiophenyl group, or combinations thereof, without being limited thereto.

As used herein, the term "non-silicon" means that a corresponding compound is free from silicon (Si).

As used herein, the term "photocurable monomer" refers to a monomer having a vinyl group, an allyl group and/or a (meth)acrylate group as a photocurable functional group.

As used herein, the term "composition for encapsulation of an organic light emitting device" can be represented by "encapsulation composition" or "composition".

As used herein, the term "etching rate of an organic barrier layer due to plasma" or "plasma etching rate" refers to a value calculated by Equation 2 after the following procedures: an initial height T1 (unit: μm) of an organic barrier layer, which is formed by depositing a composition for encapsulation of an organic light emitting device to a predetermined thickness and photocuring the composition, is measured, followed by measuring height T2 (unit: μm) of the organic barrier layer after plasma treatment under conditions of inductively coupled plasma (ICP) power: 2,500 W, radio frequency (RF) power: 300 W, DC bias: 200 V, Ar flow: 50 sccm, etching time: 1 min and pressure: 10 mtorr. Here, the initial height (T1) of the organic barrier layer may range from about 1 μm to about 10 μm. The value calculated by Equation 2 is inversely proportional to plasma resistance of the organic barrier layer.

Plasma etching rate of organic barrier layer (%)=
(T1−T2)/T1×100                    <Equation 2>

Hereinafter, a composition for encapsulation of an organic light emitting device according to one embodiment of the present invention (hereinafter, "encapsulation composition") will be described.

The encapsulation composition according to this embodiment includes: (A) a non-silicone-based photocurable polyfunctional monomer, (B) a silicone-based photocurable polyfunctional monomer, (C) a non-silicone-based photocurable monofunctional monomer, (D) a silicone-based photocurable monofunctional monomer, and (E) an initiator, wherein the (B) silicone-based photocurable polyfunctional monomer may be represented by Formula 1:

<Formula 1> wherein in Formula 1, $R_1$, $R_2$, $R_3$, $R_4$, $X_1$, $X_2$, $X_3$, $X_4$, $X_5$, $X_6$, and n are the same as disclosed in the following description.

The encapsulation composition according to this embodiment may include the (A) non-silicone-based photocurable polyfunctional monomer, the (B) silicone-based photocurable polyfunctional monomer represented by Formula 1, the (C) non-silicone-based photocurable monofunctional monomer, and the (D) silicone-based photocurable monofunctional monomer. Thus, the encapsulation composition according to this embodiment can have considerably improved photocuring rate. In addition, the encapsulation composition according to this embodiment can realize an organic barrier layer having high post-curing light transmittance and very high plasma resistance. As a result, the encapsulation composition according to this embodiment can improve reliability of an organic light emitting device. Further, the encapsulation composition according to this embodiment can realize an organic barrier layer having low post-curing modulus and thus can be used in a flexible display.

Specifically, the encapsulation composition according to this embodiment may have a photocuring rate of about 88% or higher, for example, about 88% to about 99%. In addition, the encapsulation composition may have a post-curing light transmittance of about 93% or higher at a wavelength of about 380 nm to about 700 nm, for example, about 93% to about 100%. Further, the encapsulation composition according to this embodiment may have a post-curing plasma etching rate of an organic barrier layer of about 10% or less, for example, about 0.1% to about 10%, about 0.1% to about 9%, or about 0.1% to about 8%. Moreover, the encapsulation composition may have a post-curing Young's modulus (elastic modulus) of an organic barrier layer of 6.5 GPa or less, specially about 0.1 GPa to about 6 GPa. Within these ranges of the photocuring rate and the plasma etching rate, the encapsulation composition can remarkably improve reliability of the organic light emitting device and thus can be used in an organic light emitting display. Within this range of the modulus, the encapsulation composition can be used in a flexible organic light emitting display.

Herein, the (A) non-silicone-based photocurable polyfunctional monomer, the (B) silicone-based photocurable polyfunctional monomer represented by Formula 1, the (C) non-silicone-based photocurable monofunctional monomer, and the (D) silicone-based photocurable monofunctional monomer, and the (E) initiator are different compounds. These compounds may be used alone or as a mixture thereof.

In one embodiment, the encapsulation composition may include about 10 wt % to about 50 wt % of the (A) non-silicone-based photocurable polyfunctional monomer, about 20 wt % to about 70 wt % of the (B) silicone-based photocurable polyfunctional monomer, about 5 wt % to about 50 wt % of the (C) non-silicone-based photocurable monofunctional monomer, about 1 wt % to about 50 wt % of the (D) silicone-based photocurable monofunctional monomer, and about 1 wt % to about 10 wt % of the (E) initiator, based on the total weight of (A), (B), (C), (D), and (E).

(A) Non-Silicone-Based Photocurable Polyfunctional Monomer

The (A) non-silicone-based photocurable polyfunctional monomer may be a photocurable monomer having at least two, specifically 2 to 6. photocurable functional groups. Particularly, the (A) non-silicone-based photocurable polyfunctional monomer may be a non-silicone-based di(meth)acrylate. The non-silicone-based di(meth)acrylate has low viscosity at 25° C. to reduce viscosity of the encapsulation composition, thereby allowing easy formation of an organic barrier layer through inkjet printing or the like.

The (A) non-silicone-based photocurable polyfunctional monomer is a non-aromatic monomer free from an aromatic group and may include a non-silicone-based di(meth)acrylate containing a substituted or unsubstituted long-chain alkylene group. In this case, the encapsulation composition allows easy formation of an organic barrier layer on an organic light emitting device or an inorganic barrier layer encapsulating the organic light emitting device through deposition or the like.

Specifically, the (A) non-silicone-based photocurable polyfunctional monomer may include a di(meth)acrylate having a substituted or unsubstituted $C_1$ to $C_{30}$ alkylene group, more specifically a di(meth)acrylate having an unsubstituted $C_1$ to $C_{15}$ alkylene group between (meth)acrylate groups. Here, the number of carbon atoms of the alkylene group means the number of carbon atoms present only in the alkylene group excluding carbon atoms of the di(meth)acrylate group.

In one embodiment, the non-silicone-based di(meth)acrylate may be represented by Formula 2:

<Formula 2> wherein in Formula 2, $R_3$, $R_4$ are each independently hydrogen or a methyl group, and $R_5$ is a substituted or unsubstituted $C_1$ to $C_{30}$ alkylene group.

With the non-silicone-based photocurable polyfunctional monomer represented by Formula 2, the encapsulation composition according to this embodiment can further improve the photocuring rate and has low viscosity to allow easier deposition. For example, in Formula 2, $R_5$ is an unsubstituted $C_4$ to $C_{30}$ alkylene group, preferably an unsubstituted $C_6$ to $C_{20}$ alkylene group, more preferably an unsubstituted $C_6$ to $C_{12}$ alkylene group. More specifically, the non-silicone-based di(meth)acrylate may include at least one of butanediol di(meth)acrylate, hexanediol di(meth)acrylate, octanediol di(meth)acrylate, nonanediol di(meth)acrylate, decanediol di(meth)acrylate, undecanediol di(meth)acrylate, and dodecanediol di(meth)acrylate.

The (A) non-silicone-based photocurable polyfunctional monomer may be present in an amount of about 10 wt % to about 50 wt %, for example, about 10 wt % to about 30 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, or about 30 wt %, based on the total weight of (A), (B), (C), (D), and (E). Within this range, the encapsulation composition can realize an organic barrier layer having improved properties in terms of photocuring rate and light transmittance and having low plasma etching rate.

(B) Silicone-Based Photocurable Polyfunctional Monomer

The (B) silicone-based photocurable polyfunctional monomer includes at least one substituted or unsubstituted $C_6$ to $C_{30}$ aryl group coupled to a silicon atom. As a result, the encapsulation composition can realize an organic barrier layer that exhibits very high plasma resistance to provide low plasma etching rate.

The (B) silicone-based photocurable polyfunctional monomer is a silicone-based di(meth)acrylate and may be represented by Formula 1:

<Formula 1>

Wherein in Formula 1, $R_1$ and $R_2$ are each independently a single bond, a substituted or unsubstituted $C_1$ to $C_{20}$ alkylene group, *—N(R')—(R'')—* (* being a binding site for an element, R' being hydrogen or a substituted or unsubstituted $C_1$ to $C_{30}$ alkyl group, and R'' being a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—(R')—O—** (* being a binding site for O in Formula 1, ** being a binding site for Si in Formula 1, and R' being a substituted or unsubstituted $C_1$ to $C_{30}$ alkylene group), $X_1$, $X_2$, $X_3$, $X_4$, $X_5$, and $X_6$ are each independently hydrogen, a hydroxyl group, a halogen, a cyano group, a substituted or unsubstituted $C_1$ to $C_{30}$ alkyl group, a substituted or unsubstituted $C_1$ to $C_{30}$ heterocycloalkyl group, a substituted or unsubstituted $C_3$ to $C_{30}$ cycloalkyl group, a substituted or unsubstituted $C_1$ to $C_{30}$ alkoxy group, *—N(R')(R'') (* being a binding site for an element, R' and R'' being each independently hydrogen or a substituted or unsubstituted $C_1$ to $C_{30}$ alkyl group), a substituted or unsubstituted $C_1$ to $C_{30}$ alkylsulfide group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group, at least one of $X_1$, $X_2$, $X_3$, $X_4$, $X_5$ and $X_6$ being a substituted or unsubstituted $C_6$ to $C_{30}$ aryl group or a substituted or unsubstituted $C_2$ to $C_{30}$ heteroaryl group, $R_3$ and $R_4$ are each independently hydrogen or a methyl group, and n is an integer of 0 to 30 or has an average value of 0 to 30. Here, the term "single bond" refers to a direct bond between Si and O (Si—O) in Formula 1.

Specifically, in Formula 1, $R_1$ and $R_2$ may be each independently a single bond, a substituted or unsubstituted $C_1$ to $C_{20}$ alkylene group, or *—(R')—O—** (* being a binding site for O in Formula 1, ** being a binding site for Si in Formula 1, and R' being a substituted or unsubstituted $C_1$ to $C_{30}$ alkylene group).

Specifically, in Formula 1, $X_1$, $X_2$, $X_3$, $X_4$, $X_5$ and $X_6$ may be each independently hydrogen, a substituted or unsubstituted $C_1$ to $C_{30}$ alkyl group, a substituted or unsubstituted $C_3$ to $C_{30}$ cycloalkyl group, a substituted or unsubstituted $C_1$ to $C_{30}$ alkoxy group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group, wherein at least one of $X_1$, $X_2$, $X_3$, $X_4$, $X_5$, and $X_6$ may be a substituted or unsubstituted $C_6$ to $C_{30}$ aryl group.

More specifically, in Formula 1, $R_1$ and $R_2$ may be each independently a single bond or a substituted or unsubstituted $C_1$ to $C_{20}$ alkylene group. In this case, the encapsulation composition can further reduce the plasma etching rate.

More specifically, in Formula 1, $X_1$, $X_2$, $X_3$, $X_4$, $X_5$ and $X_6$ may be each independently a substituted or unsubstituted $C_1$ to $C_{10}$ alkyl group or a substituted or unsubstituted $C_6$ to $C_{10}$ aryl group, wherein at least one of $X_1$, $X_2$, $X_3$, $X_4$, $X_5$, and $X_6$ may be a substituted or unsubstituted $C_6$ to $C_{10}$ aryl group. More specifically, $X_1$, $X_2$, $X_3$, $X_4$, $X_5$ and $X_6$ may be each independently a methyl group, an ethyl group, a propyl group, a butyl group, a pentyl group, a phenyl group, a biphenyl group or a naphthyl group, wherein one, two, three or six of $X_1$, $X_2$, $X_3$, $X_4$, $X_5$ and $X_6$ may be a phenyl group or a naphthyl group. In this case, the encapsulation composition can further reduce the plasma etching rate. More specifically, n may be an integer of 1 to 5. In this case, the encapsulation composition can further reduce the plasma etching rate.

More specifically, n may be an integer of 1 to 30.

Specifically, the silicone-based di(meth)acrylate may be represented by one of Formulae 3 to 9:

<Formula 3>

<Formula 4>

<Formula 5>

-continued

<Formula 6>

<Formula 7>

<Formula 8>

<Formula 9>

The (B) silicone-based photocurable polyfunctional monomer may be present in an amount of about 20 wt % to about 70 wt %, specifically about 25 wt % to about 65 wt %, about 25 wt % to about 60 wt %, about 25 wt % to about 50 wt %, about 25 wt % to about 45 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, or about 45 wt %, based on the total weight of (A), (B), (C), (D), and (E). Within this range, the encapsulation composition can have high photocuring rate and can realize an organic barrier layer having high light transmittance and low plasma etching rate.

The (A) non-silicone-based photocurable polyfunctional monomer and the (B) silicone-based photocurable polyfunctional monomer may be present in a total amount of about 30 wt % to about 60 wt %, specifically about 30 wt % to about 55 wt %, about 30 wt % to about 50 wt %, about 35 wt % to about 55 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, about 50 wt %, about 51 wt %, about 52 wt %, about 53 wt %, about 54 wt %, about 55 wt %, based on the total weight of (A), (B), (C), (D), and (E). Within this range, the encapsulation composition can realize an organic barrier layer having low plasma etching rate.

The (B) silicone-based photocurable polyfunctional monomer may be prepared by any typical method known in the art. For example, the (B) silicone-based photocurable polyfunctional monomer may be prepared by reacting a compound for extending a carbon chain (for example, allyl alcohol) with a siloxane compound in which a substituted or unsubstituted $C_6$ to $C_{30}$ aryl group or a substituted or unsubstituted $C_2$ to $C_{30}$ heteroaryl group is coupled to at least one silicon atom, followed by reaction of the reaction product with (meth)acryloyl chloride, without being limited thereto. Alternatively, the (B) silicone-based photocurable polyfunctional monomer may be prepared by reacting (meth)acryloyl chloride with a siloxane compound in which a substituted or unsubstituted $C_6$ to $C_{30}$ aryl group or a substituted or unsubstituted $C_2$ to $C_{30}$ heteroaryl group is coupled to at least one silicon atom, without being limited thereto.

(C) Non-Silicone-Based Photocurable Monofunctional Monomer

The (C) non-silicone-based photocurable monofunctional monomer can increase the photocuring rate of the encapsulation composition and increase light transmittance of the organic barrier layer.

The (C) non-silicone-based photocurable monofunctional monomer is a non-silicone-based mono(meth)acrylate and may include at least one of an aromatic mono(meth)acrylate having an aromatic group and a non-aromatic mono(meth)acrylate not containing an aromatic group. Since both the aromatic mono(meth)acrylate and the (B) silicone-based photocurable polyfunctional monomer include the aromatic groups, the aromatic mono(meth)acrylate and the (B) silicone-based photocurable polyfunctional monomer exhibit further improved compatibility when used together in the encapsulation composition. Thus, the aromatic mono(meth)acrylate can further improve miscibility with the (B) silicone-based photocurable polyfunctional monomer. As a result, the encapsulation composition can remarkably reduce the plasma etching rate of the organic barrier layer.

The aromatic mono(meth)acrylate may include a substituted or unsubstituted aromatic group-containing mono(meth)acrylate. Here, the term "aromatic group" means a monocyclic aromatic group or a polycyclic aromatic group including fused forms and the like, or means a form in which single rings are connected to each other by a sigma bond. For example, the aromatic group may mean at least one of a substituted or unsubstituted $C_6$ to $C_{50}$ aryl group, a substituted or unsubstituted $C_7$ to $C_{50}$ arylalkyl group, a substituted or unsubstituted $C_3$ to $C_{50}$ heteroalkyl group, and a substituted or unsubstituted $C_3$ to $C_{50}$ heteroarylalkyl group. More specifically, the aromatic group may include at least one of phenyl, biphenyl, terphenyl, quaterphenyl, naphthyl, anthracenyl, phenanthrenyl, chrysenyl, triphenylenyl, tetracenyl, pyrenyl, benzopyrenyl, pentacenyl, coronenyl, ovalenyl, corannulenyl, benzyl, pyridinyl, pyrazinyl, pyrimidinyl, pyridazinyl, triazinyl, quinolinyl, isoquinolinyl, quinoxalinyl, acridinyl, quinazolinyl, cinnolinyl, phthalazinyl, thiazolyl, benzothiazolyl, isoxazolyl, benzisoxazolyl, oxazolyl, benzoxazolyl, pyrazolyl, indazolyl, imidazolyl, benzimidazolyl, purinyl, thiophenyl, benzothiophenyl, furanyl, benzofuranyl, and isobenzofuranyl groups.

For example, the aromatic mono(meth)acrylate may be represented Formula 10:

<Formula 10>

Wherein in Formula 10, $R_3$ is hydrogen or a methyl group; s is an integer of 0 to 10; and $R_6$ is a substituted or unsubstituted $C_6$ to $C_{50}$ aryl group or a substituted or unsubstituted $C_6$ to $C_{50}$ aryloxy group.

For example, $R_6$ may be a phenylphenoxyethyl group, a phenoxyethyl group, a benzyl group, a phenyl group, a phenylphenoxy group, a phenoxy group, a phenylethyl group, a phenylpropyl group, a phenylbutyl group, a methylphenylethyl group, propylphenylethyl group, a methoxyphenylethyl group, a cyclohexylphenylethyl group, a chlorophenylethyl group, a bromophenylethyl group, a methylphenyl group, a methylethylphenyl group, a methoxyphenyl group, a propylphenyl group, a cyclohexylphenyl group, a chlorophenyl group, a bromophenyl group, a phenylphenyl group, a biphenyl group, a terphenyl group, a quaterphenyl group, an anthracenyl group, a naphthalenyl group, a triphenylenyl group, a methylphenoxy group, an ethylphenoxy group, a methylethylphenoxy group, a methoxyphenyloxy group, a propylphenoxy group, a cyclohexylphenoxy group, a chlorophenoxy group, a bromophenoxy group, a biphenyloxy group, a terphenyloxy group, a quaterphenyloxy group, an anthracenyloxy group, a naphthalenyloxy group, or a triphenylenyloxy group.

Specifically, the aromatic mono(meth)acrylate may include at least one of 2-phenylphenoxyethyl (meth)acrylate, phenoxyethyl (meth)acrylate, phenyl (meth)acrylate, phenoxy (meth)acrylate, 2-ethylphenoxy (meth)acrylate, benzyl (meth)acrylate, 2-phenylethyl (meth)acrylate, 3-phenylpropyl (meth)acrylate, 4-phenylbutyl (meth)acrylate, 2-(2-methylphenyl)ethyl (meth)acrylate, 2-(3-methylphenyl)ethyl (meth)acrylate, 2-(4-methylphenyl)ethyl (meth)acrylate, 2-(4-propylphenyl)ethyl (meth)acrylate, 2-(4-(1-methylethyl)phenyl)ethyl (meth)acrylate, 2-(4-methoxyphenyl)ethyl (meth)acrylate, 2-(4-cyclohexylphenyl)ethyl (meth)acrylate, 2-(2-chlorophenyl)ethyl (meth)acrylate, 2-(3-chlorophenyl)ethyl (meth)acrylate, 2-(4-chlorophenyl)ethyl (meth)acrylate, 2-(4-bromophenyl)ethyl (meth)acrylate, 2-(3-phenylphenyl)ethyl (meth)acrylate, 4-(biphenyl-2-yloxy)butyl (meth)acrylate, 3-(biphenyl-2-yloxy)butyl (meth)acrylate, 2-(biphenyl-2-yloxy)butyl (meth)acrylate, 1-(biphenyl-2-yloxy)butyl (meth)acrylate, 4-(biphenyl-2-yloxy)propyl (meth)acrylate, 3-(biphenyl-2-yloxy)propyl (meth)acrylate, 2-(biphenyl-2-yloxy)propyl (meth)acrylate, 1-(biphenyl-2-yloxy)propyl (meth)acrylate, 4-(biphenyl-2-yloxy)ethyl (meth)acrylate, 3-(biphenyl-2-yloxy)ethyl (meth)acrylate, 2-(biphenyl-2-yloxy)ethyl (meth)acrylate, 1-(biphenyl-2-yloxy)ethyl (meth)acrylate, 2-(4-benzylphenyl)ethyl (meth)acrylate, 1-(4-benzylphenyl)ethyl (meth)acrylate, and structural isomers thereof, without being limited thereto. That is, it should be understood that the (meth)acrylates as set forth herein are provided by way of example only and the present invention is not limited thereto. Further, the (meth)acrylates according to the present invention include all acrylates corresponding to structural isomers. For example, although only 2-phenylethyl (meth)acrylate is mentioned by way of example, the (meth)acrylates according to the present invention include all of 3-phenylethyl (meth)acrylate and 4-phenyl (meth)acrylate.

The non-aromatic mono(meth)acrylate may be a substituted or unsubstituted $C_1$ to $C_{20}$ alkyl group-containing mono(meth)acrylate. Specifically, the non-aromatic mono(meth)acrylate may be an unsubstituted linear $C_1$ to $C_{20}$ alkyl group-containing mono(meth)acrylate, more specifically an unsubstituted linear $C_{10}$ to $C_{20}$ alkyl group-containing mono(meth)acrylate. For example, the non-aromatic mono(meth)acrylate may include a least one of decyl (meth)acrylate, undecyl (meth)acrylate, lauryl (meth)acrylate, tridecyl (meth)acrylate, tetradecyl (meth)acrylate, pentadecyl (meth)acrylate, hexadecyl (meth)acrylate, heptadecyl (meth)acrylate, octadecyl (meth)acrylate, nonadecyl (meth)acrylate, and arachidyl (meth)acrylate, without being limited thereto.

The (C) non-silicone-based photocurable monofunctional monomer may be present in an amount of about 5 wt % to about 50 wt %, specifically about 5 wt % to about 45 wt %, about 5 wt % to about 40 wt %, about 5 wt % to about 35 wt %, about 5 wt % to about 30 wt %, about 15 wt % to about 35 wt %, for example, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, or about 35 wt %, based on the total weight of (A), (B), (C), (D), and (E). Within this range, the encapsulation composition can have increased photocuring rate. In addition, the encapsulation composition can realize an organic barrier layer having high light transmittance and low plasma etching rate.

(D) Silicone-Based Photocurable Monofunctional Monomer

The (D) silicone-based photocurable monofunctional monomer can reduce post-curing modulus of an organic barrier layer, which is formed of the encapsulation composition, thereby allowing the encapsulation composition to be used in a flexible organic light emitting display.

The (D) silicone-based photocurable monofunctional monomer is a silicon-based mono(meth)acrylate and may be represented by Formula 11:

<Formula 11>

Wherein in Formula 11, $R_3$ is hydrogen or a methyl group; n is an integer of 1 or more;

$Y_1$, $Y_2$, and $Y_3$ are identical to or different from one another and are each independently a substituted or unsubstituted $C_1$ to $C_{30}$ alkyl group, a substituted or unsubstituted $C_1$ to $C_{30}$ alkoxy group, a substituted or unsubstituted $C_6$ to $C_{20}$ aryloxy group, a substituted or unsubstituted $C_1$ to $C_{30}$ dialkylamine group, a substituted or unsubstituted $C_1$ to $C_{30}$ alkylsulfide group, a substituted or unsubstituted $C_6$ to $C_{30}$ aryl group, a substituted or unsubstituted $C_7$ to $C_{30}$ arylalkyl group, or a functional group represented by Formula 12:

<Formula 12>

(wherein in Formula 12, * is a binding site for Si in Formula 11;

m is an integer of 1 or more;

$Z_1$, $Z_2$ and $Z_3$ are identical to or different from one another and are each independently a substituted or unsubstituted $C_1$ to $C_{30}$ alkyl group, a substituted or unsubstituted $C_1$ to $C_{30}$ alkoxy group, a substituted or unsubstituted $C_6$ to $C_{20}$ aryloxy group, a substituted or unsubstituted $C_1$ to $C_{30}$ dialkylamine group, a substituted or unsubstituted C1 to C30 alkylsulfide group, a substituted or unsubstituted $C_6$ to $C_{30}$ aryl group, or a substituted or unsubstituted $C_7$ to $C_{30}$ arylalkyl group); and when $Y_1$, $Y_2$ or $Y_3$ is a functional group represented by Formula 12 and m is 2 or more, functional groups represented by Formula 12 and contained in the (D) silicone-based photocurable monofunctional monomer may be identical to or different from one another.

Specifically, n and m may be each independently an integer of 1 to 10. In one embodiment, at least one of $Y_1$, $Y_2$ and $Y_3$ may include a substituted or unsubstituted $C_6$ to $C_{30}$ aryl group or a substituted or unsubstituted $C_7$ to $C_{30}$ arylalkyl group. Specifically, $Y_1$, $Y_2$ and $Y_3$ may be each independently a substituted or unsubstituted $C_1$ to $C_{10}$ alkyl group, a substituted or unsubstituted $C_6$ to $C_{10}$ aryl group, or a functional group represented by Formula 12 in which $Z_1$, $Z_2$ and $Z_3$ are each independently a substituted or unsubstituted $C_1$ to $C_{10}$ alkyl group, preferably a substituted or unsubstituted $C_1$ to $C_5$ alkyl group, or a substituted or unsubstituted $C_6$ to $C_{10}$ aryl group. In one embodiment, at least one of $Y_1$, $Y_2$, and $Y_3$ may be a functional group represented by Formula 12.

In Formula 11, when $Y_1$, $Y_2$, or $Y_3$ is a functional group represented by Formula 12 and m is 2 or more, functional groups represented by Formula 12 and contained in the (D) silicone-based photocurable monofunctional monomer may be identical to one another or may be different from one another as in Formula 13.

The (D) silicone-based photocurable monofunctional monomer may include at least one of compounds represented by Formulae 13 to 17:

<Formula 13>

<Formula 14>

<Formula 15>

<Formula 16>

<Formula 17>

The (D) silicone-based photocurable monofunctional monomer may be prepared by any typical method known in the art. For example, the (D) silicone-based photocurable monofunctional monomer may be prepared by reacting an allyl alcohol with a specific siloxane compound, followed by reaction of the reaction product with (meth)acryloyl chloride, without being limited thereto.

The (D) silicone-based photocurable monofunctional monomer may be present in an amount of about 1 wt % to about 50 wt %, specifically about 1 wt % to about 50 wt %, about 1 wt % to about 45 wt %, about 1 wt % to about 40 wt %, about 1 wt % to about 35 wt %, about 1 wt % to about 30 wt %, about 1 wt % to about 25 wt %, about 10 wt % to about 30 wt %, for example, about 1 wt %, about 2 wt %, about 3 wt %, about 4 wt %, about 5 wt %, about 6 wt %, about 7 wt %, about 8 wt %, about 9 wt %, about 10 wt %, about 11 wt %, about 12 wt %, about 13 wt %, about 14 wt %, about 15 wt %, about 16 wt %, about 17 wt %, about 18 wt %, about 19 wt %, about 20 wt %, about 21 wt %, about 22 wt %, about 22 wt %, about 23 wt %, about 24 wt %, about 25 wt %, about 26 wt %, about 27 wt %, about 28 wt %, about 29 wt %, about 30 wt %, about 31 wt %, about 32 wt %, about 33 wt %, about 34 wt %, about 35 wt %, about 36 wt %, about 37 wt %, about 38 wt %, about 39 wt %, about 40 wt %, about 41 wt %, about 42 wt %, about 43 wt %, about 44 wt %, about 45 wt %, about 46 wt %, about 47 wt %, about 48 wt %, about 49 wt %, or about 50 wt %, based on the total weight of (A), (B), (C), (D), and (E). Within this range, the encapsulation composition can realize an organic barrier layer having low modulus.

(E) Initiator

The (E) initiator allows an organic barrier layer to be formed by curing the (A) non-silicone-based photocurable polyfunctional monomer, the (B) silicone-based photocurable polyfunctional monomer represented by Formula 1, the (C) non-silicone-based photocurable monofunctional monomer, and the (D) silicone-based photocurable monofunctional monomer, and may include any typical photopolymerization initiator without limitation.

The (E) initiator may include at least one of triazine, acetophenone, benzophenone, thioxanthone, benzoin, phosphorus, and oxime initiators, without being limited thereto. For example, the phosphorus initiator may include diphenyl (2,4,6-trimethylbenzoyl)phosphine oxide, benzyl(diphenyl)phosphine oxide, bis(2,6-dimethoxybenzoyl)(2,4,4-trimethylpentyl)phosphine oxide, and mixtures thereof. For example, the phosphorus initiator can exhibit better initiation performance under UV light of long wavelengths in the composition according to the present invention.

The (E) initiator may be present in an amount of about 1 wt % to about 10 wt %, specifically about 1 wt % to about 5 wt %, based on the total weight of (A), (B), (C), (D), and (E). Within this range, the initiator allows sufficient photopolymerization under exposure to light and can further reduce unreacted initiator remaining after photopolymerization, thereby further improving light transmittance of an organic barrier layer.

The encapsulation composition may be formed as a solvent-free composition not containing a solvent. For example, when the encapsulation composition is a solvent-free composition, wt % is based on the total weight of (A), (B), (C), (D), and (E).

The encapsulation composition may have a viscosity at 25° C.±2° C. (23° C. to 27° C.) of about 0 cP to about 200 cP, specifically about 100 cP or less, more specifically about 5 cP to about 50 cP, about 5 cP to about 40 cP, or about 5 cP to about 30 cP. Within this range, the encapsulation composition allows easy formation of an organic barrier layer. Within this range, it is advantageous to perform a method such as deposition and inkjet printing upon formation of an organic barrier layer.

The encapsulation composition is a photocurable composition and may be cured by UV irradiation at about 10 mW/cm² to about 500 mW/cm² for about 1 second to about 100 seconds, without being limited thereto.

The encapsulation composition may be used in encapsulation of an organic light emitting device. Particularly, the encapsulation composition may be used in both a non-flexible organic light emitting display and a flexible organic light emitting display.

The encapsulation composition may be used in encapsulation of a member for an apparatus, particularly, a member for displays, which can suffer from degradation or deterioration in quality due to permeation of gas or liquid in a surrounding environment, for example, atmospheric oxygen and/or moisture and/or water vapor and due to permeation of chemicals used in the preparation of electronic products. Examples of the member for an apparatus may include illumination devices, metal sensor pads, microdisc lasers, electrochromic devices, photochromic devices, microelectromechanical systems, solar cells, integrated circuits, charge coupled devices, light emitting polymers, light emitting diodes, and the like, without being limited thereto.

Next, a composition for encapsulation of an organic light emitting device according to another embodiment of the present invention will be described.

The composition for encapsulation of an organic light emitting device according to this embodiment includes (A) a non-silicone-based photocurable polyfunctional monomer, (B) a silicone-based photocurable polyfunctional monomer, (C) a non-silicone-based photocurable monofunctional monomer, (D) a silicone-based photocurable monofunctional monomer, (E) an initiator, and (F) a heat stabilizer, wherein the (B) silicone-based photocurable polyfunctional monomer may be represented by Formula 1. As a result, the encapsulation composition according to this embodiment can suppress change in viscosity at room temperature. The encapsulation composition according to this embodiment can further improve light transmittance and photocuring rate while reducing the plasma etching rate, as compared with the encapsulation composition not including the heat stabilizer. Except for the heat stabilizer, the encapsulation composition according to this embodiment is substantially the same as the composition for encapsulation of an organic light emitting device according to the above embodiment. Thus, the following description will be given only of the heat stabilizer.

In the encapsulation composition, the (F) heat stabilizer serves to suppress change in viscosity of the encapsulation composition at room temperature and may include any typical heat stabilizers. In some embodiments, the (F) heat stabilizer may be a sterically hindered phenolic heat stabilizer. Specifically, the (F) heat stabilizer may include at least one of pentaerythritoltetrakis[3-(3,5-di-tert-butyl-4-hydroxyphenyl)propionate], stearyl-3-(3,5-di-t-butyl-4-hydroxyphenyl)propionate, 1,3,5-tris(2,6-dimethyl-3-hydroxy-4-t-butylbenzyl)isocyanurate, 1,3,5-tris(3,5-di-t-butyl-4-hydroxybenzyl)isocyanurate, 1,3,5-tris(2-hydroxyethyl)isocyanurate, pentaerythritoltetrakis[3-(3,5-di-t-butylhydroxyphenyl)propionate], and tris(4-t-butyl-3-hydroxy-2,6-dimethylbenzyl)isocyanurate, without being limited thereto. The (F) heat stabilizer may be present in an amount of about 2,000 ppm or less, specifically about 0.01 ppm to about 2,000 ppm, more specifically about 100 ppm to about 800 ppm based on the total weight of (A), (B), (C), (D), and (E). Within this range, the heat stabilizer can further improve storage stability and processability of the encapsulation composition in a liquid state.

An organic light emitting display according to the present invention may include an organic barrier layer formed of the composition for encapsulation of an organic light emitting device according to the embodiments of the invention. Specifically, the organic light emitting display may include an organic light emitting device; and a barrier stack formed on the light emitting device and including an inorganic barrier layer and an organic barrier layer, which may be formed of the composition for encapsulation of an organic light emitting device according to the embodiments of the present invention. As a result, the organic light emitting display can exhibit high reliability.

In the organic light emitting display according to the present invention, the organic barrier layer may be formed by inkjet printing or deposition of the composition for encapsulation of an organic light emitting device.

Figure 1:
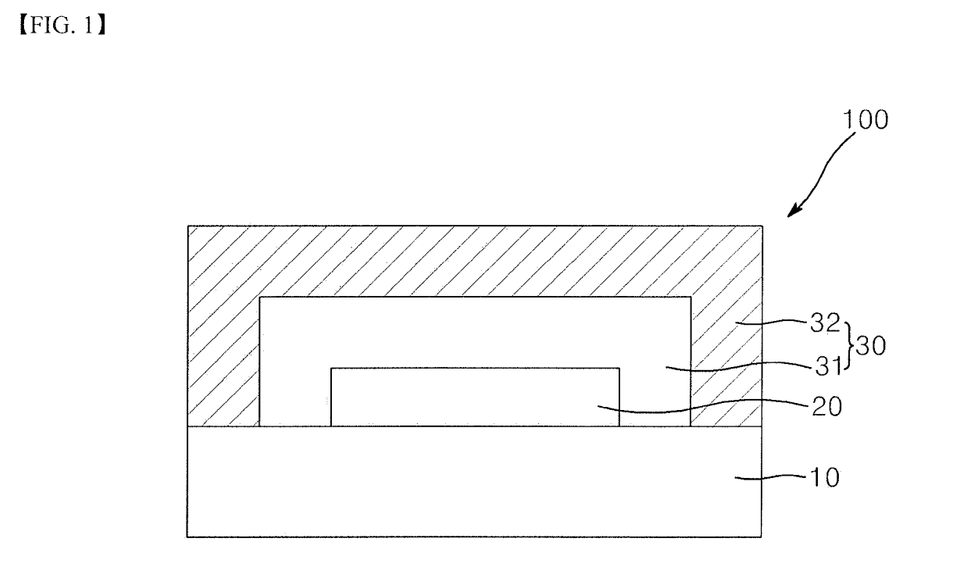
FIG. 1 is a sectional view of an organic light emitting display according to one embodiment of the present invention.

Next, an organic light emitting display according to one embodiment of the invention will be described with reference to FIG. 1. FIG. 1 is a sectional view of an organic light emitting display according to one embodiment of the present invention.

Referring to FIG. 1, an organic light emitting display 100 according to this embodiment includes a substrate 10, an organic light emitting device 20 formed on the substrate 10, and a barrier stack 30 formed on the organic light emitting device 20 and including an inorganic barrier layer 31 and an organic barrier layer 32, wherein the inorganic barrier layer 31 adjoins the organic light emitting diode 20 and the organic barrier layer 32 may be formed of the composition for encapsulation of an organic light emitting device according to the embodiments of the present invention.

The substrate 10 is not particularly restricted so long as an organic light emitting device can be formed on the substrate. For example, the substrate 10 may be formed of a material, such as transparent glass, a plastic sheet, and a silicon or metal substrate.

The organic light emitting device 20 is commonly used in an organic light emitting display, and, although not shown in FIG. 1, may include a first electrode, a second electrode, and an organic light emitting layer formed between the first electrode and the second electrode. In addition, the organic light emitting layer may have a structure wherein a hole injection layer, a hole transport layer, a light emitting layer, an electron transport layer, and an electron injection layer are sequentially stacked, without being limited thereto.

The barrier stack 30 includes the inorganic and organic barrier layers, and the inorganic and organic barrier layers are composed of different components, thereby realizing the respective functions of encapsulating the organic light emitting device.

The inorganic barrier layer includes different components than the organic barrier layer, thereby supplementing the effects of the organic barrier layer. The inorganic barrier layer may be formed of inorganic materials having good light transmittance and good moisture and/or oxygen barrier properties. For example, the inorganic barrier layer may include at least one selected from among metals; nonmetals; compounds or alloys of at least two metals; compounds or alloys of at least two nonmetals; oxides of metals, nonmetals or mixtures thereof; fluorides of metals or nonmetals or mixtures thereof; nitrides of metals, nonmetals or mixtures thereof; carbides of metals, nonmetals or mixtures thereof; oxynitrides of metals, nonmetals or mixtures thereof; borides of metals, nonmetals or mixtures thereof; oxyborides of metals, nonmetals or mixtures thereof; silicides of metals, nonmetals or mixtures thereof; and mixtures thereof. The metals or nonmetals may include silicon (Si), aluminum (Al), selenium (Se), zinc (Zn), antimony (Sb), indium (In), germanium (Ge), tin (Sn), bismuth (Bi), transition metals, and lanthanide metals, without being limited thereto. Specifically, the inorganic barrier layer may be silicon oxide ($SiO_x$), silicon nitride ($SiN_x$), silicon oxynitride ($SiO_xN_y$), zinc selenide (ZnSe), zinc oxide (ZnO), antimony trioxide ($Sb_2O_3$), aluminum oxide ($AlO_x$) including alumina ($Al_2O_3$), indium oxide ($In_2O_3$), or tin oxide ($SnO_2$).

The inorganic barrier layer may be deposited by a plasma process or a vacuum process, for example, sputtering, chemical vapor deposition, plasma chemical vapor deposition, evaporation, sublimation, electron cyclotron resonance-plasma enhanced chemical vapor deposition, or combinations thereof. The inorganic barrier layer may have a thickness of about 40 nm to about 1,000 nm, specifically about 100 nm to about 1,000 nm.

The organic and inorganic barrier layers are alternately deposited, thereby securing smoothing properties of the inorganic barrier layer, while preventing defects of one inorganic barrier layer from spreading to other inorganic barrier layers.

The organic barrier layer may be formed by deposition, inkjet printing, screen printing, spin coating, blade coating, or curing of the composition for encapsulation of an organic light emitting device, or combinations thereof. For example, the organic barrier layer may be formed by coating the composition for encapsulation of an organic light emitting diode to a thickness of about 1 μm to about 50 μm, followed by curing the composition through irradiation at about 10 $mW/cm^2$ to about 500 $mW/cm^2$ for about 1 second to about 100 seconds. The organic barrier layer may have a thickness of about 1 μm to about 50 Vim.

The barrier stack may include any number of organic and inorganic barrier layers. Combination of the organic and inorganic barrier layers may vary with a level of permeation resistance to oxygen and/or moisture and/or water vapor and/or chemicals. For example, the organic and inorganic barrier layers are formed in a total of 10 layers or less, for example, 2 layers to 7 layers. Specifically, the organic and inorganic barrier layers are formed in a total of 7 layers in the following order: inorganic barrier layer/organic barrier layer/inorganic barrier layer/organic barrier layer/inorganic barrier layer/organic barrier layer/inorganic barrier layer.

In the barrier stack, the organic and inorganic barrier layers may be alternately deposited. This is because the aforementioned composition has an effect on the organic barrier layer due to the properties thereof. As a result, the organic and inorganic barrier layers can supplement or reinforce encapsulation of the member for the apparatus.

Figure 2:
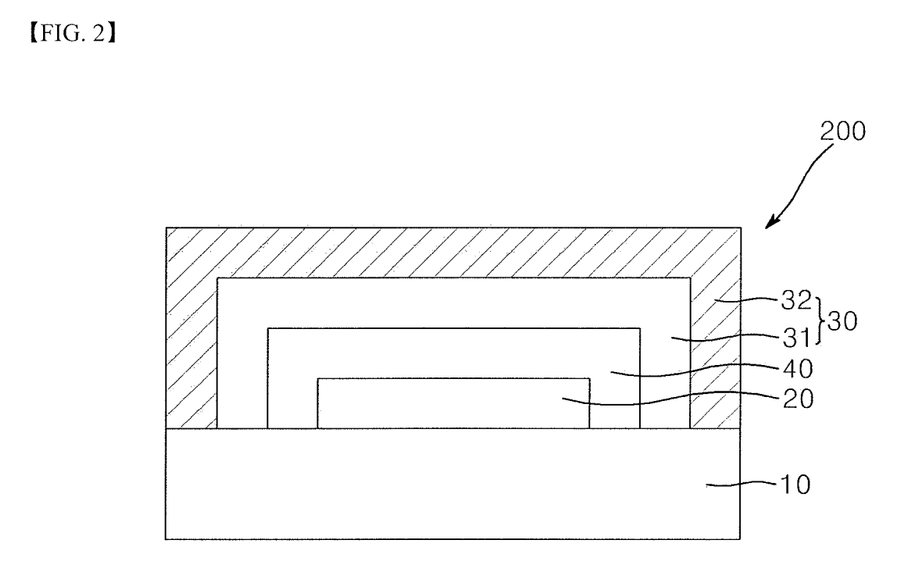
FIG. 2 is a sectional view of an organic light emitting display according to another embodiment of the present invention.

Next, an organic light emitting display according to another embodiment of the invention will be described with reference to FIG. 2. FIG. 2 is a sectional view of an organic light emitting display according to another embodiment of the present invention.

Referring to FIG. 2, an organic light emitting display 200 according to this embodiment includes a substrate 10, an organic light emitting device 20 formed on the substrate 10, and a barrier stack 30 formed on the organic light emitting device 20 and including an inorganic barrier layer 31 and an organic barrier layer 32, in which the inorganic barrier layer 31 encapsulates an inner space 40 which receives the organic light emitting device 20 therein, and the organic barrier layer 32 may be formed of the composition for encapsulation of an organic light emitting device according to the embodiments of the invention. The organic light emitting display 200 according to this embodiment is substantially the same as the organic light emitting display according to the above embodiment except that the inorganic barrier layer does not adjoin the organic light emitting device.

MODE FOR INVENTION

Next, the present invention will be described in more detail with reference to some examples. It should be understood that these examples are provided for illustration only and are not to be construed in any way as limiting the present invention.

Preparative Example 1

In a 1,000 ml flask provided with a cooling tube and a stirrer, 300 ml of ethyl acetate, 21 g of 3,3-diphenyl-1,1,5, 5-tetramethyltrisiloxane and 43 g of allyl alcohol (Daejung Chemicals & Materials Co., Ltd.) were placed, followed by nitrogen purging for 30 minutes. Next, 72 ppm of Pt-on-carbon black powder (Aldrich GmbH) was added thereto, followed by heating the flask to 80° C. and stirring the components for 4 hours. The remaining solvent was removed by distillation, thereby obtaining a compound. 71.5 g of the obtained compound and 39 g of triethylamine were sequentially added to 300 ml of dichloromethane, followed by slowly adding 30.2 g of methacryloyl chloride while stirring the mixture at 0° C. The remaining solvent was removed by distillation, thereby obtaining a monomer represented by Formula 4 and having a purity of 95% as determined by HPLC (molecular weight: 584.92 g/mol). (1H NMR: δ7.52, m, 6H; δ7.42, m, 4H; δ6.25, d, 2H; δ6.02, dd, 2H; δ5.82, t, 1H; δ5.59, d, 2H; δ3.86, m, 4H; δ1.52, m, 4H; δ0.58, m, 4H; δ0.04, m, 12H).

<Formula 4>

Preparative Example 2

A monomer represented by Formula 9 was obtained in the same manner as in Preparative Example 1 except that 25 g of 3-phenyl-1,1,3,5,5-pentamethyltrisiloxane (Gelest Inc.) was used instead of 21 g of 3,3-diphenyl-1,1,5,5-tetramethyltrisiloxane.

<Formula 9>

Preparative Example 3

In a 1,000 ml flask provided with a cooling tube and a stirrer, 300 ml of ethyl acetate, 25 g of 3-phenyl-1,1,1,3,5,5-hexamethyltrisiloxane (Gelest Inc.) and 47 g of allyl alcohol were placed, followed by nitrogen purging for 30 minutes. Next, 72 ppm of Pt-on-carbon black powder (Aldrich GmbH) was added thereto, followed by heating the flask to 80° C. and stirring the components for 4 hours. The remaining solvent was removed by distillation, thereby obtaining a compound. 65.5 g of the obtained compound and 48 g of triethylamine were sequentially added to 300 ml of dichloromethane, followed by slowly adding 31.3 g of methacryloyl chloride while stirring the mixture at 0° C. The remaining solvent was removed by distillation, thereby obtaining a monomer represented by Formula 13 and having a purity of 97% as determined by HPLC (molecular weight: 410.73 g/mol). (1H NMR: δ7.61, m, 3H; δ7.12, m, 2H; δ6.25, d, 1H; δ6.02, dd, 1H; δ3.87, m, 2H; δ2.82, s, 3H; δ1.54, m, 2H; δ0.58, m, 2H; δ0.02, m, 18H).

<Formula 13>

Preparative Example 4

A monomer represented by Formula 14 and having a purity of 96% as determined by HPLC (molecular weight: 410.73 g/mol) was obtained in the same manner as in Preparative Example 3 except that 25 g of 3-phenyl-1,1,1,5,5,5-hexamethyltrisiloxane (Gelest Inc.) was used instead of 25 g of 3-phenyl-1,1,1,3,5,5-hexamethyltrisiloxane (Gelest Inc.). (1H NMR: δ7.61, m, 3H; δ7.12, m, 2H; δ6.25, d, 1H; δ6.02, dd, 1H; δ3.87, m, 2H; δ2.82, s, 3H δ1.54, m, 2H; δ0.58, m, 2H; δ0.02, m, 18H).

<Formula 14>

Details of components used in Examples and Comparative Examples were as follows.

(A) Non-silicone-based photocurable polyfunctional monomer: (A1) 1,12-dodecanediol dimethacrylate (Sartomer Co., Ltd.), (A2) 1,6-hexanediol dimethacrylate (Sartomer Co., Ltd.)

(B) Silicone-based photocurable polyfunctional monomer: (B1) monomer of Preparative Example 1, (B2) monomer of Preparative Example 2

(C) Non-silicone-based photocurable monofunctional monomer: 2-phenylphenoxyethyl acrylate (Hitachi Chemical Co., Ltd.)

(D) Silicone-based photocurable monofunctional monomer: (D1) monomer of Preparative Example 3, (D2) monomer of Preparative Example 4

(E) Initiator: Phosphorus initiator, Darocur TPO (BASF)

Example 1

19 parts by weight of (A1), 29 parts by weight of (B2), 29 parts by weight of (C), 20 parts by weight of (D1), and 3 parts by weight of (E) were placed in a 125 ml brown polypropylene bottle, and mixed by a shaker at room temperature for 3 hours, thereby obtaining an encapsulation composition.

Examples 2 to 5, Comparative Examples 1 and 2, and Reference Example 1

Encapsulation compositions were prepared in the same manner as in Example 1 except that the kinds and/or contents of (A), (B), (C), (D), and (E) were changed as listed in Table 1 (unit: parts by weight).

Each of the encapsulation compositions prepared in Examples, Comparative Examples, and Reference Example was evaluated as to properties as listed in Table 1. Results are shown in Table 1.

TABLE 1

|     |      | Example |      |      |      |      | Comparative Example |      | Reference Example |
|-----|------|------|------|------|------|------|------|------|------|
|     |      | 1 | 2 | 3 | 4 | 5 | 1 | 2 | 1 |
| (A) | (A1) | 19 | 19 | 19 | — | — | 68 | 39 | 39 |
|     | (A2) | — | — | — | 19 | 19 | — | — | — |
| (B) | (B1) | — | 29 | — | 29 | — | — | 29 | 29 |
|     | (B2) | 29 | — | 29 | — | 29 | — | — | — |
| (C) |      | 29 | 29 | 29 | 29 | 29 | 29 | — | 29 |
| (D) | (D1) | 20 | — | — | 20 | 20 | — | 29 | — |
|     | (D2) | — | 20 | 20 | — | — | — | — | — |
| (E) |      | 3 | 3 | 3 | 3 | 3 | 3 | 3 | 3 |
| Modulus (GPa) | | 4.5 | 5.3 | 3.5 | 5.4 | 4 | 11.2 | 4.3 | 6.9 |
| Photocuring rate (%) | | 93.2 | 92.3 | 91.5 | 93.2 | 92.1 | 93.2 | 91.2 | 92.3 |
| Plasma etching rate (%) | | 7.6 | 6.6 | 7.4 | 6.3 | 7.2 | 7.6 | 13.5 | 7.2 |

As shown in Table 1, the composition for encapsulation of an organic light emitting device according to the present invention could realize an organic barrier layer having high photocuring rate, high light transmittance, and low plasma etching rate, thereby improving reliability of an organic light emitting device. In addition, the composition for encapsulation of an organic light emitting device according to the present invention could realize an organic barrier layer having low modulus so as to be used in a flexible display.

Conversely, the encapsulation compositions prepared in Comparative Examples 1 and 2, which were free from one of (A), (B) and (C) had a problem of high modulus or high plasma etching rate. In addition, the encapsulation composition prepared in Reference Example 1, which was free from (D), realized an organic barrier layer having considerably high plasma etching rate.

<Property Evaluation>

(1) Modulus: Each of the prepared encapsulation compositions was deposited to a predetermined thickness, followed by curing through UV irradiation at a wavelength of 395 nm at 500 mJ to obtain an organic barrier layer having a thickness of 30 μm, thereby preparing a specimen for modulus measurement. Modulus of the specimen was measured using a Nano Indenter G200 (Agilent Inc.) in a manner of 5 s loading, 2 s hold loading and 5 s unloading under conditions of experiment mode: indentation mode (using Berkovitz), control mode: force control, Max. force: 60 μN (0213-TJ: 54 μN by 100 nm displacement control) at room temperature (20° C. to 25° C.).

(2) Photocuring rate: The encapsulation composition was measured as to intensity of absorption peaks in the vicinity of 1635 $cm^{-1}$ (C=C) and 1720 $cm^{-1}$ (C=O) using an FT-IR spectrometer (NICOLET 4700, Thermo Co., Ltd.). The encapsulation composition was applied to a glass substrate through a sprayer, followed by curing through UV irradiation at 100 mW/$cm^2$ for 10 seconds, thereby preparing a specimen having a size of 20 cm×20 cm×3 μm (width× length×thickness). Then, the intensity of absorption peaks of the cured film was measured in the vicinity of 1635 $cm^{-1}$ (C=C) and 1720 $cm^{-1}$ (C=O) using an FT-IR spectrometer (NICOLET 4700, Thermo Co., Ltd.). Photocuring rate was calculated by Equation 1:

Photocuring rate (%)=|1−(*A/B*)|×100          <Equation 1> wherein Equation 1, A is a ratio of the intensity of an absorption peak in the vicinity of 1,635 $cm^{-1}$ to the intensity of an absorption peak in the vicinity of 1,720 $cm^{-1}$ measured for the cured film, and B is a ratio of the intensity of an absorption peak in the vicinity of 1,635 $cm^1$ to the intensity of an absorption peak in the vicinity of 1,720 $cm^{-1}$ measured for the encapsulation composition.

(3) Plasma etching rate: The encapsulation composition was deposited to a predetermined thickness and photocured to form an organic barrier layer, followed by measuring the initial deposition height (T1, 1 μm to 10 m) of the organic barrier layer. The organic barrier layer was subjected to plasma treatment under conditions of ICP power: 2500 W, RE power: 300 W, DC bias: 200 V, Ar flow: 50 sccm, etching time: 1 min and pressure: 10 mTorr, followed by measuring the height (T2, unit: μm) of the organic barrier layer. The plasma etching rate of the organic barrier layer was calculated by Equation 2:

<Equation 2>

Plasma etching rate of organic barrier layer (%)= (*T*1−*T*2)/*T*1×100          (2),

It should be understood that various modifications, changes, alterations, and equivalent embodiments can be made by those skilled in the art without departing from the spirit and scope of the invention.

The invention claimed is:

1. A composition for encapsulation of an organic light emitting device, comprising:
(A) a non-silicone-based photocurable polyfunctional monomer; (B) a silicone-based photocurable polyfunctional monomer; (C) a non-silicone-based photocurable monofunctional monomer; (D) a silicone-based photocurable monofunctional monomer; and (E) an initiator, wherein the (B) silicone-based photocurable polyfunctional monomer is represented by Formula 1:

<Formula 1> where in Formula 1, $R_1$ and $R_2$ are each independently a single bond, a substituted or unsubstituted $C_1$ to $C_{20}$ alkylene group, *—N(R')—(R")—* (* being a binding site for an element, R' being hydrogen or a substituted or unsubstituted $C_1$ to $C_{30}$ alkyl group, and R" being a substituted or unsubstituted $C_1$ to $C_{20}$ alkylene group), a substituted or unsubstituted $C_6$ to $C_{30}$ arylene group, a substituted or unsubstituted $C_7$ to $C_{30}$ arylalkylene group, or *—(R')—O—** (* being a binding site for O in Formula 1, ** being a binding site for Si in Formula 1, and R' being a substituted or unsubstituted $C_1$ to $C_{30}$ alkylene group),

$X_1$, $X_2$, $X_3$, $X_4$, $X_5$, and $X_6$ are each independently hydrogen, a hydroxyl group, a halogen, a cyano group, a substituted or unsubstituted $C_1$ to $C_{30}$ alkyl group, a substituted or unsubstituted $C_1$ to $C_{30}$ heterocycloalkyl group, a substituted or unsubstituted $C_3$ to $C_{30}$ cycloalkyl group, a substituted or unsubstituted $C_1$ to $C_{30}$ alkoxy group, *—N(R')(R") (* being a binding site for an element and R' and R" being each independently hydrogen or a substituted or unsubstituted $C_1$ to $C_{30}$ alkyl group), a substituted or unsubstituted $C_1$ to $C_{30}$ alkylsulfide group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group, at least one of $X_1$, $X_2$, $X_3$, $X_4$, $X_5$ and $X_6$ being a substituted or unsubstituted $C_6$ to $C_{30}$ aryl group or a substituted or unsubstituted $C_2$ to $C_{30}$ heteroaryl group, $R_3$ and $R_4$ are each independently hydrogen or a methyl group, and n is an integer from 0 to 30 or has an average value of 0 to 30, and wherein the (D) silicone-based photocurable monofunctional monomer comprises at least one of compounds represented by Formulae 15, 16, and 17:

<Formula 15>

<Formula 16>

<Formula 17>

2. The composition according to claim 1, wherein, in Formula 1, $R_1$ and $R_2$ are each independently a single bond, a substituted or unsubstituted $C_1$ to $C_{20}$ alkylene group, or *—(R')—O—** (* being a binding site for O in Formula 1, ** being a binding site for Si in Formula 1, and R' being a substituted or unsubstituted $C_1$ to $C_{30}$ alkylene group); and

$X_1$, $X_2$, $X_3$, $X_4$, $X_5$ and $X_6$ are each independently hydrogen, a substituted or unsubstituted $C_1$ to $C_{30}$ alkyl group, unsubstituted $C_3$ to $C_{30}$ cycloalkyl group, a substituted or unsubstituted $C_1$ to $C_{30}$ alkoxy group, a substituted or unsubstituted $C_6$ to $C_{30}$ aryl group, a substituted or unsubstituted $C_2$ to $C_{30}$ heteroaryl group, or a substituted or unsubstituted $C_7$ to $C_{30}$ arylalkyl group, at least one of $X_1$, $X_2$, $X_3$, $X_4$, $X_5$, and $X_6$ being a substituted or unsubstituted $C_6$ to $C_{30}$ aryl group.

3. The composition according to claim 1, wherein the (B) silicone-based photocurable polyfunctional monomer is represented by one of Formulae 3 to 9:

<Formula 3>

<Formula 4>

-continued

<Formula 5>

<Formula 6>

<Formula 7>

<Formula 8>

<Formula 9>

4. The composition according to claim 1, wherein the (A) non-silicone-based photocurable polyfunctional monomer is represented by Formula 2:

<Formula 2> where in Formula 2, $R_3$ and $R_4$ are each independently hydrogen or a methyl group, and $R_5$ is a substituted or unsubstituted $C_1$ to $C_{30}$ alkylene group.

5. The composition according to claim 1, wherein the (C) non-silicone-based photocurable monofunctional monomer comprises an aromatic mono(meth)acrylate.

6. The composition according to claim 1, comprising: about 10 wt % to about 50 wt % of the (A) non-silicone-based photocurable polyfunctional monomer; about 20 wt % to about 70 wt % of the (B) silicone-based photocurable polyfunctional monomer; about 5 wt % to about 50 wt % of the (C) non-silicone-based photocurable monofunctional monomer; about 1 wt % to about 50 wt % of the (D) silicone-based photocurable monofunctional monomer;
and about 1 wt % to about 10 wt % of the (E) initiator, based on the total weight of (A), (B), (C), (D), and (E).

7. The composition according to claim 1, further comprising: a heat stabilizer.

8. The composition according to claim 7, wherein the heat stabilizer is present in an amount of about 0.01 ppm to about 2,000 ppm based on the total weight of (A), (B), (C), (D), and (E).

9. An organic light emitting display, comprising:
an organic light emitting device; and
a barrier stack formed on the organic light emitting device and comprising an inorganic barrier layer and an organic barrier layer,
wherein the organic barrier layer is formed of the composition for encapsulation of an organic light emitting device according claim 1.

10. The organic light emitting display according to claim 9, wherein the organic barrier layer has a modulus of about 6.5 GPa or less.

* * * * *